(12) United States Patent
Kant et al.

(10) Patent No.: US 6,442,099 B1
(45) Date of Patent: Aug. 27, 2002

(54) LOW POWER READ SCHEME FOR MEMORY ARRAY STRUCTURES

(75) Inventors: Shree Kant, Fremont; Gajendra P. Singh, Sunnyvale, both of CA (US)

(73) Assignee: Sun Microsystems, Inc., CA (US)

( * ) Notice: Subject to any disclaimer, the term of this patent is extended or adjusted under 35 U.S.C. 154(b) by 0 days.

(21) Appl. No.: 09/837,390

(22) Filed: Apr. 18, 2001

(51) Int. Cl.$^7$ ................................................ G11C 8/00
(52) U.S. Cl. .................... 365/230.03; 365/72
(58) Field of Search ............................... 365/72, 230.03

(56) References Cited

U.S. PATENT DOCUMENTS 5,461,587 A * 10/1995 Oh .............................. 365/200
6,038,193 A 3/2000 Wang et al. ............ 365/230.05

FOREIGN PATENT DOCUMENTS

JP 0285587 * 11/1990 ......... G11C/11/412

OTHER PUBLICATIONS

Betty Prince, "Semiconductor Memories", 1983, Wiley, 2$^{nd}$ edition pp. 255–257.*

* cited by examiner

*Primary Examiner*—M. Tran
(74) *Attorney, Agent, or Firm*—Rosenthal & Osha L.L.P.

(57) ABSTRACT

A method and apparatus for consuming low power when accessing data from a memory array is provided. Further, a method and apparatus for consuming low power when accessing data from a segmented bit line structure in a register file is provided by using transistors having progressively smaller widths as the storage cells or segments they are in get closer to an output of the segmented bit line structure. Further, a method and apparatus for consuming low power when accessing data from a differential bit line structure in a register file is provided by using transistors having progressively smaller widths as the storage cells they are in get closer to an output of the differential bit line structure. Further, a method and apparatus for consuming low power when accessing data from a segmented differential bit line structure in a register file is provided by using transistors having progressively smaller widths as the storage cells or segments they are in get closer to an output of the segmented differential bit line structure.

36 Claims, 10 Drawing Sheets

LOW POWER READ SCHEME FOR MEMORY ARRAY STRUCTURES

BACKGROUND OF INVENTION

BACKGROUND ART

A typical modem computer system includes a microprocessor, memory, and peripheral computer resources, i.e., monitor, keyboard, software programs, etc. The microprocessor has, among other components, arithmetic, logic, and control circuitry that interpret and execute instructions from a computer program. FIG. 1 shows a prior art diagram of an example of a computer's microprocessor (20) that has a central processing unit ("CPU" and also known as "execution unit") (22), a memory controller (24) (also known as a "load/store unit"), and on-board, or level 1 ("L1"), cache memory (26). The microprocessor (20) is connected to external, or level 2 ("L2"), cache memory (28), and the processor is also connected to the main memory (30) of the computer system. Cache memory is a region of fast memory that holds copies of data.

One goal of the computer system is to execute instructions provided by the computer's users and software programs. The execution of instructions is carried out by the CPU (22). Data needed by the CPU (22) to carry out an instruction are fetched by the memory controller (24) and loaded into the internal registers (32) of the CPU (22). Upon command from the CPU (22), the CPU (22) searches for the requested data in the internal registers (32). If the requested data is not available in the internal registers (32), the memory controller (24) searches for requested data first in the fast on-board cache memory (26), then in the slower external cache memory (28), and if those searches turn out unsuccessful, then the memory controller (24) retrieves the data from the slowest form of memory, the main memory (30).

The internal registers (32) of the CPU (22) are formed by a plurality of register files ("RFs"). Register files are an integral part of a microprocessor (20) because they are the local most memory available to the CPU (22). Typically, requested data that is in L1 cache (26) or L2 cache (28) is available to the CPU (22) three or more clock cycles after cycle in which the CPU (22) made the data request. However, requested data that is in the register files is usually available to the CPU (22) during the same cycle in which the CPU (22) made the data request. Therefore, the speed and performance of the register files is a significant factor in determining the overall speed and performance of the microprocessor (20).

Register files are generally arranged in one or more memory arrays. A memory array is a structure in which a plurality of storage cells are arranged such that data in each storage cell can be accessed by the selection of one or more bit lines that are used to read data from the memory array. Often, an array of register file cells is partitioned into a plurality of subsets of rows, with each subset connected to a respective local bit line segment.

FIG. 2 shows a prior art segmented bit line structure of a register file. In a segmented bit line structure, groups of register file cells are segmented along a bit line. For example, in the segmented bit line structure (40) shown in FIG. 2, register file cells (42, 44, 46, 48, 50, 52) are segmented into a plurality of segments (41, 45, 49). Each segment (41, 45, 49) is connected to a respective local bit line segment (43, 47, 51).

The bit line segments (43, 47, 51) are connected in series, with the first bit line segment (43) connected to the input of a first sense amplifier (also referred to as "first local sense amplifier") (54). The output of the first local sense amplifier (54) is connected to the second bit line segment (47), which is, in turn, connected to the input of a second sense amplifier (also referred to as "second local sense amplifier) (56). The output of the second local sense amplifier (56) is connected to the last bit line segment (51), which is, in turn, connected to the input of a global sense amplifier (58). The global sense amplifier (58) generates an output, OUT, of the segmented bit line structure (40).

The local and global sense amplifiers (54, 56, 58) each have a precharge input, PRE, that is used to precharge the bit line segment connected to their respective inputs. Thus, each local bit line segment (43, 47, 51) has its own sense amplifier and precharge. This is necessary, because, due to the relatively small size of register file cells, register file cells cannot discharge bit lines very fast, i.e., register file cells are relatively slow when putting data on a bit line, and therefore, sense amplifiers are used to detect small changes on a bit line and output a full data value based on such bit line value changes caused by register file cells. Moreover, because register files need to be very fast for the reasons discussed above, the use of sense amplifiers increases the speed of accessing data as opposed to waiting for a register file cell to fully discharge a bit line. The function of the sense amplifier, in essence, is to "sense" the data in a particular register file cell. However, those skilled in the art will understand that increasing the speed of accessing data in a memory array, or that of virtually any other computer system component, requires increased power consumption.

Each register file cell (42, 44, 46, 48, 50, 52) has a respective read access transistor (60, 62, 64, 66, 68, 70), which is used to access data stored within the respective register file cell. The widths of these read access transistors (60, 62, 64, 66, 68, 70) are equal to each other.

Each bit line segment (43, 47, 51) is particularly loaded (59) due to read access transistor capacitance and the high interconnect resistance and capacitance due to the length of each bit line segment (43, 47, 51). Because each bit line segment (43, 47, 51) is heavily loaded, the time it takes to discharge a particular bit line segment is longer than the time it would take if that bit line segment was less loaded or not loaded at all.

Referring still to FIG. 2, when data is accessed from a particular register file cell, the read access transistor in that register file cell is used to discharge the bit line segment to which it is connected depending upon the value stored within the register file cell. While the register file cell discharges a bit line segment, a local sense amplifier, which has its input connected to the bit line segment, outputs a data value based on whether that bit line segment input remains precharged or is getting discharged. Thereafter, the data from the local sense amplifier ripples through the local bit line segments and local sense amplifiers in the remaining plurality of segments to the global sense amplifier, which, in turn, outputs the data value. Typically, the global sense amplifier is designed to handle the accumulation of parasitic capacitance on the local bit line segments.

FIG. 3 shows a prior art differential bit line structure of a register file. In a differential bit line structure, register file cells have differential outputs which are connected to differential bit lines, respectively. For example, in the differential bit line structure (80) shown in FIG. 3, each register file cell (82, 84, 86, 88, 90, 92) is connected to two differential bit lines (81, 83) that both serve as inputs to a differential sense amplifier (94).

The differential sense amplifier (94) has a precharge input, PRE, that is used to precharge particular nodes (not shown) within the differential sense amplifier (94). Further, the differential sense amplifier (94) generates an output, OUT, of the differential bit line structure (80).

Each respective register file cell (82, 84, 86, 88, 90, 92) has two access transistors that have complementary inputs (87 and 89, 91 and 93, 95 and 97, 99 and 101, 103 and 105, 107 and 109). The widths of these access transistors (87 and 89, 91 and 93, 95 and 97, 99 and 101, 103 and 105, 107 and 109) are equal to each other.

Each differential bit line (81, 83) is particularly loaded (85) due to access transistor capacitance and the high interconnect resistance and capacitance due to the length of each differential bit line (81, 83). Because each differential bit line (81, 83) is heavily loaded, the time it takes to discharge a particular differential bit line is longer than the time it would take if that differential bit line was less loaded or not loaded at all.

Referring still to FIG. 3, when data is accessed from a particular register file cell, the read access transistor containing the data in that register file cell is used to discharge the differential bit line to which it is connected depending upon the value stored within the register file cell. As the register file cell discharges a differential bit line, the differential sense amplifier (94) "senses" the discharging of one of its differential bit lines, and outputs accordingly. Typically, the differential sense amplifier is designed to handle the accumulation of parasitic capacitance on the differential bit lines.

SUMMARY OF INVENTION3

In one aspect, a segmented bit line structure comprises a first segment of storage cells that are connected to an input of a first local sense amplifier, wherein storage cells in the first segment each comprise at least one access transistor, and a second segment of storage cells that are connected to an input of a second local sense amplifier, wherein storage cells in the second segment each comprise at least one access transistor. The access transistors in the second segment of storage cells have smaller widths than access transistors in the first segment of storage cells.

In another aspect, a method for accessing a data value from a segmented bit line structure in a memory array comprises accessing the data value using an access transistor in a storage cell on the segmented bit line structure, wherein a width of the access transistor is related to a position of the access transistor on the segmented bit line structure in reference to an output of the segmented bit line structure, and selectively propagating the data value to the output of the segmented bit line structure.

In another aspect, a segmented differential bit line structure comprises a first segment of storage cells that are connected to inputs of a first local differential sense amplifier, wherein storage cells in the first segment each comprise complementary access transistors, and a second segment of storage cells that are connected to inputs of a second local differential sense amplifier, wherein storage cells in the second segment each comprise complementary access transistors. The widths of the complementary access transistors in the second segment of storage cells are smaller than widths of complementary access transistors in the first segment of storage cells.

In another aspect, a differential bit line structure, comprises a first storage cell, wherein the first storage cell comprises complementary access transistors, and a second storage cell, wherein the second storage cell comprises complementary access transistors. The widths of the complementary access transistors in the second storage cell are smaller than widths of the complementary access transistors in the first storage cell.

In another aspect, a method for accessing a data value from a differential bit line structure in a memory array comprises selectively accessing the data value using an access transistor in a storage cell on the differential bit line structure, wherein a width of the access transistor is related to a position of the access transistor on the differential bit line structure in reference to an output of the differential bit line structure, and selectively propagating the data value to the output of the differential bit line structure.

In another aspect, a width of at least one device in a second sense amplifier is smaller than a width of at least one device in a first sense amplifier depending upon whether the second sense amplifier has less storage cells connected to its input than does the first sense amplifier.

In another aspect, a width of at least one device in a second differential sense amplifier is smaller than a width of at least one device in a first differential sense amplifier depending upon whether the second differential sense amplifier has less storage cells connected to inputs of the second differential sense amplifier than the first differential sense amplifier.

Other aspects and advantages of the invention will be apparent from the following description and the appended claims.

DETAILED DESCRIPTION

The present invention relates to a method and apparatus that consumes low power when accessing data from a memory array structure.

The present invention uses access transistors whose widths get progressively smaller as the memory array cells, e.g., register file cells, they are in get closer to the end of a bit line. Therefore, because the widths of the access transistors get smaller, the total capacitance on a bit line is decreased, and accordingly, less power is consumed when accessing a particular memory array cell. Further, since a bit line is less loaded, the speed of operation of a register file is increased.

Figure 1:
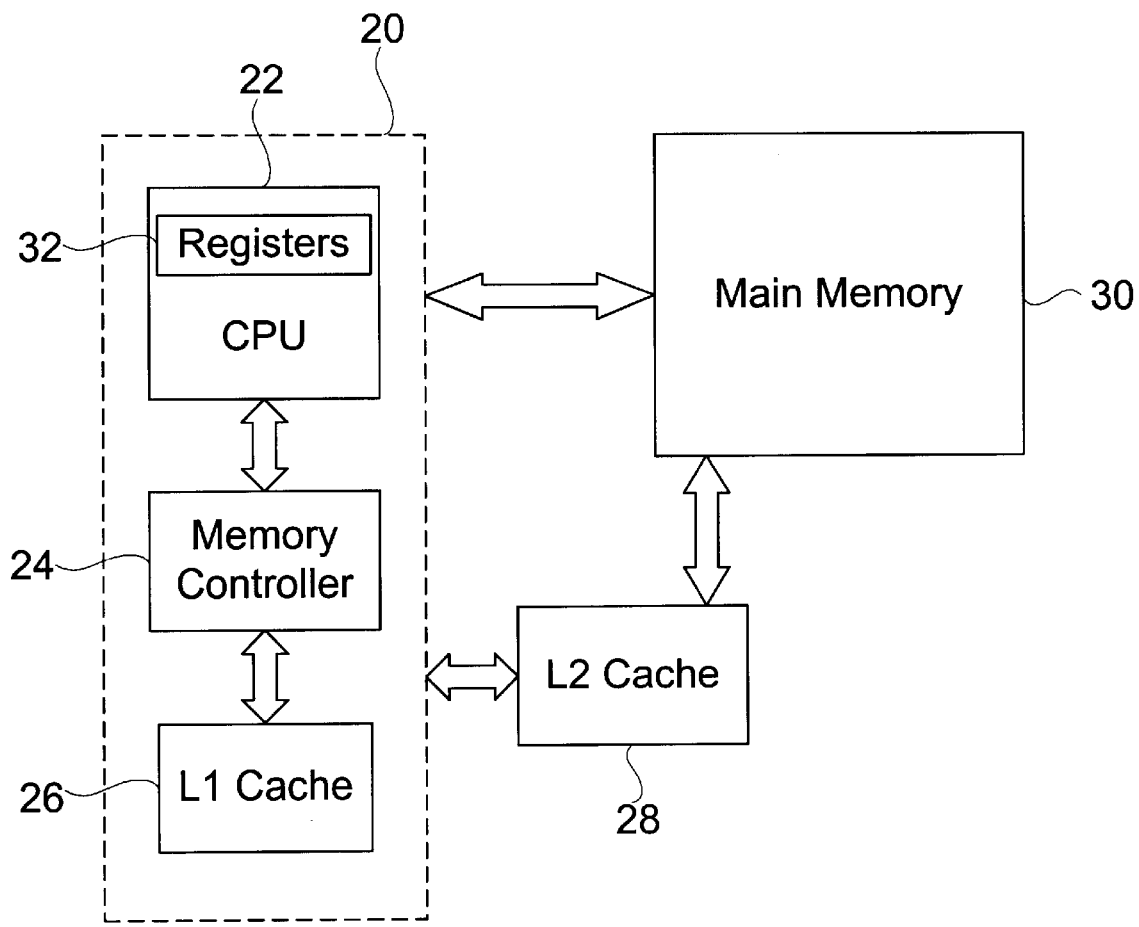
FIG. 1 shows a typical prior art computer system.
Figure 2:
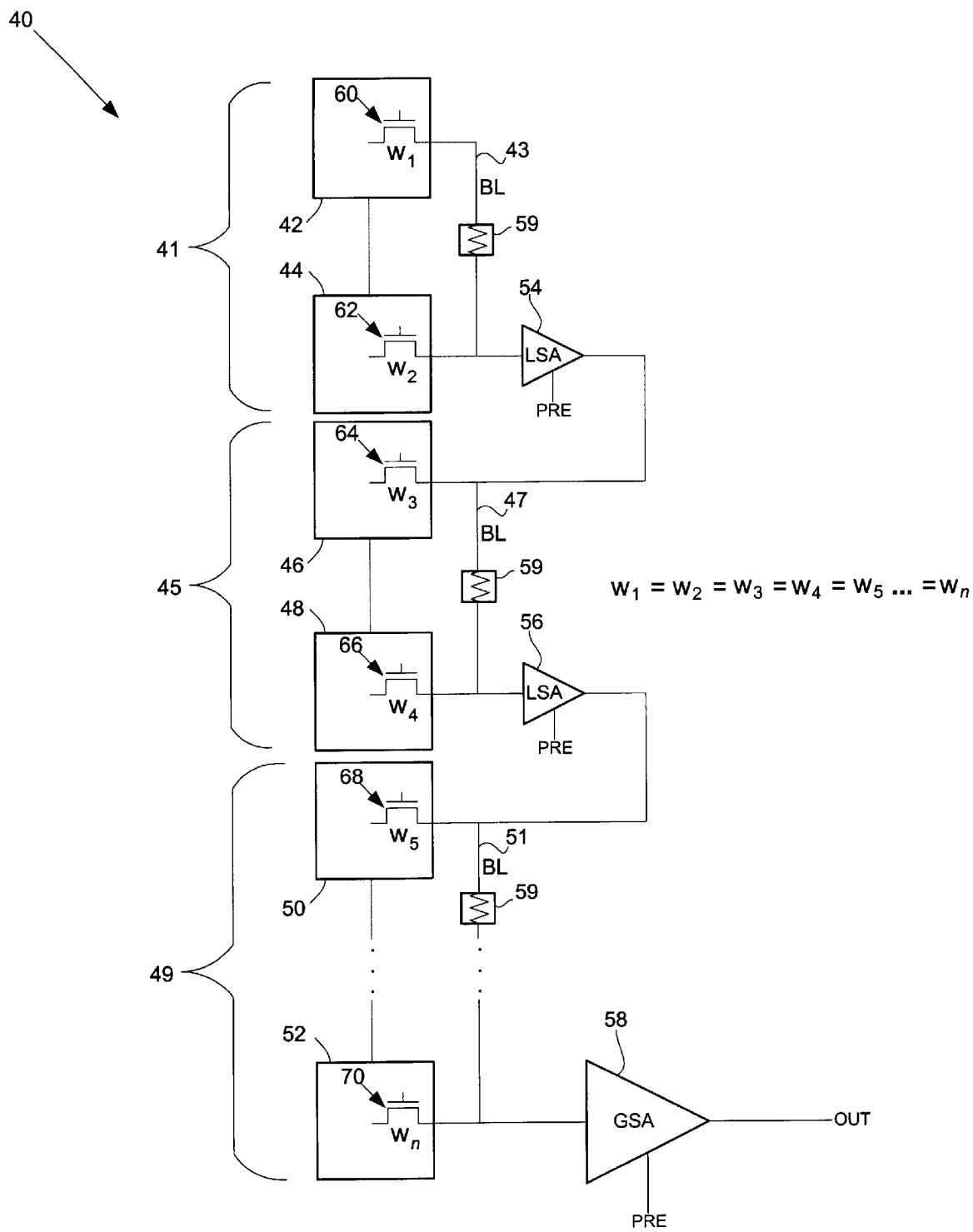
FIG. 2 shows a prior art bit line structure of a register file.
Figure 3:
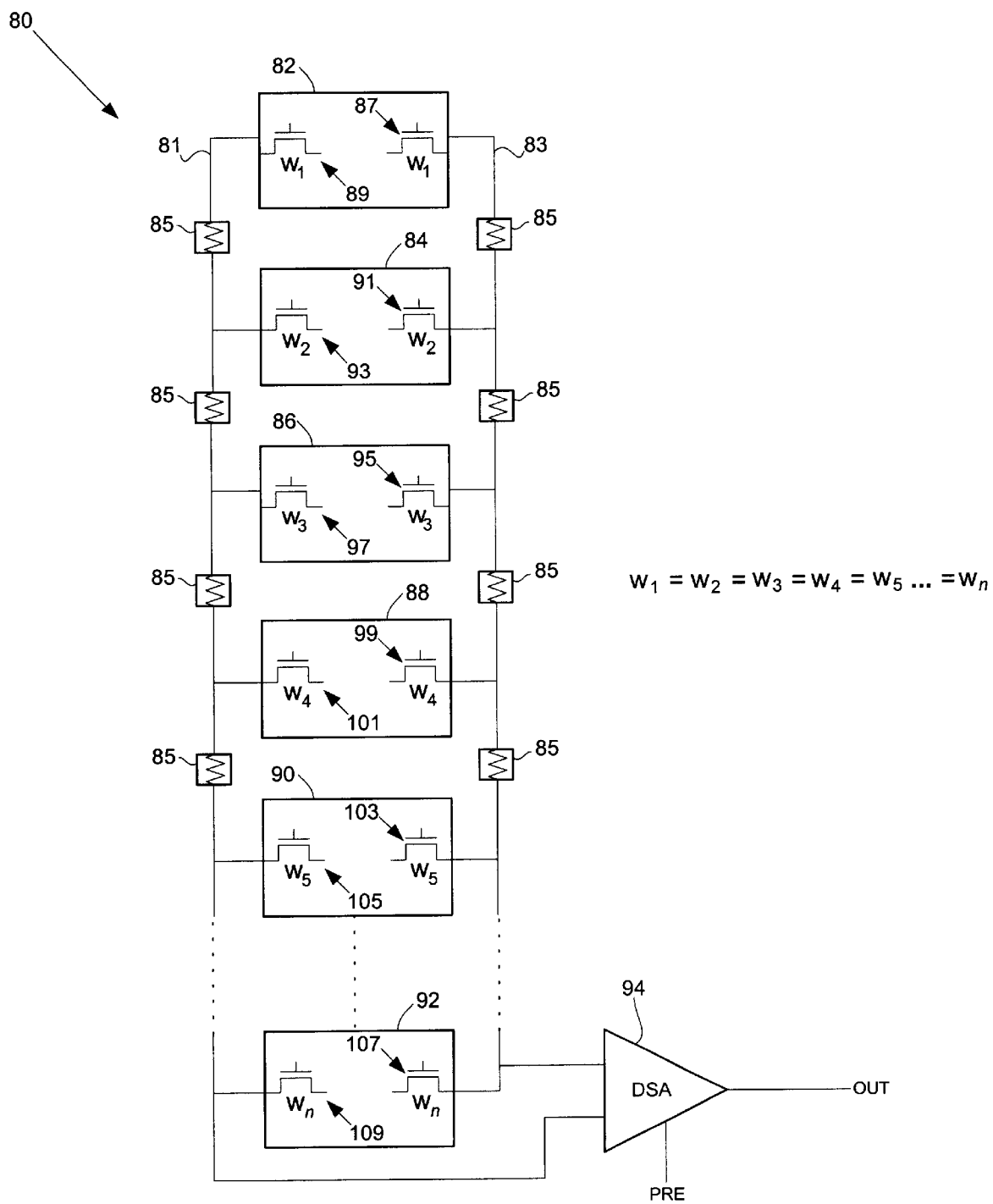
FIG. 3 shows a prior art differential bit line structure of a register file.
Figure 4A:
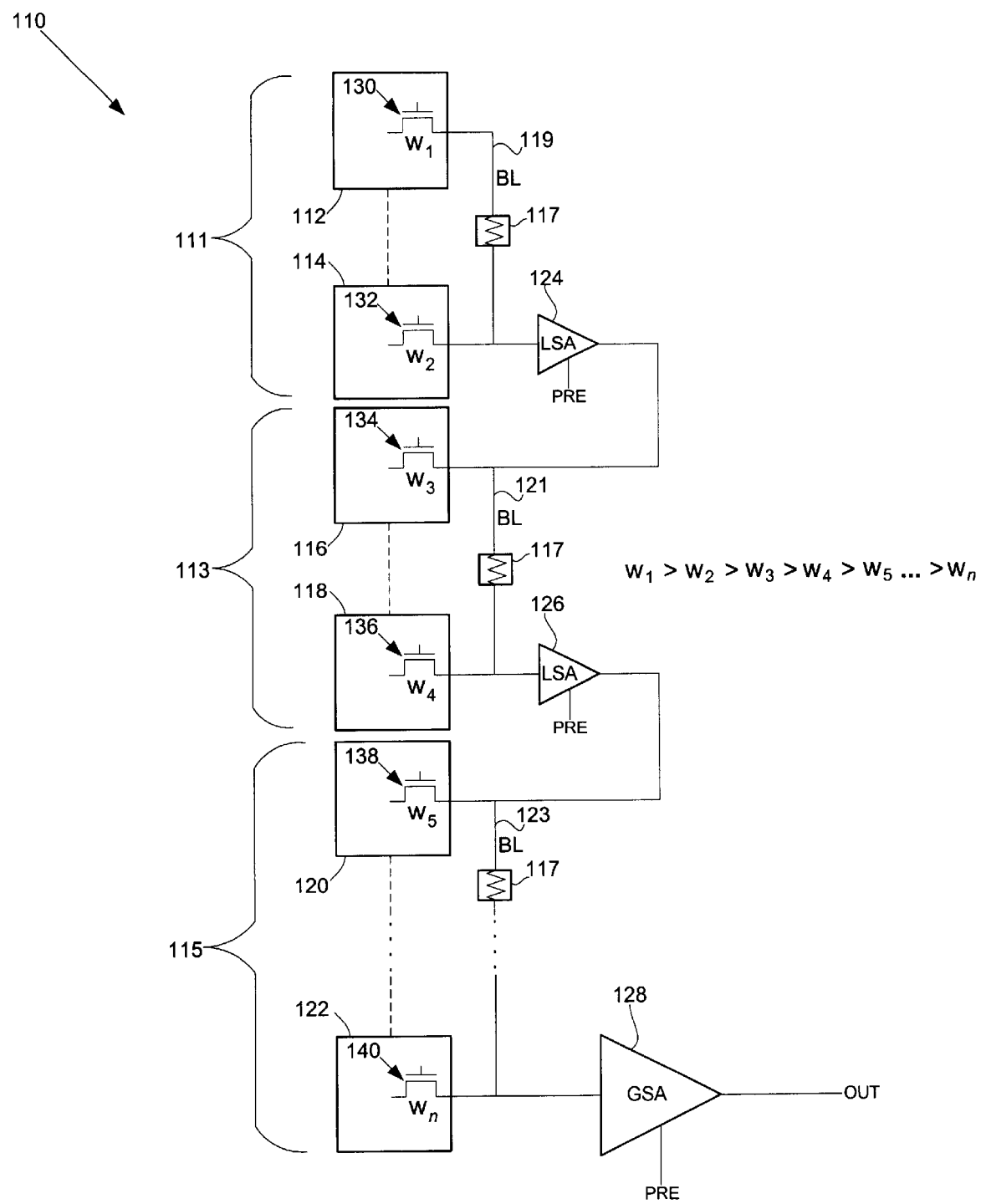
FIG. 4a shows a segmented bit line structure in accordance with an embodiment of the present invention.

FIG. 4a shows a segmented bit line structure of a memory array that consumes low power when data stored within a particular storage cell on the segmented bit line structure is accessed, i.e., read, in accordance with an exemplary embodiment of the present invention. Specifically, FIG. 4a shows a segmented bit line structure (110) of a register file.

The segmented bit line structure (110) has register file cells (112, 114, 116, 118,120, 122) that are segmented into a plurality of segments (111, 113, 115). Each segment (111, 113, 115 ) is connected to a respective local bit line segment (119, 121, 123). However, those skilled in the art will appreciate that in other embodiments, register file cells may not be segmented into a plurality of segments.

The bit line segments (119, 121, 123) are connected in series, with the first bit line segment (119) connected to the input of a first sense amplifier (also referred to as "first local sense amplifier") (124). The output of the first local sense amplifier (124) is connected to the second bit line segment (121), which is, in turn, connected to the input of a second sense amplifier (also referred to as "second local sense amplifier") (126). The output of the second local sense amplifier (126) is connected to the third bit line segment (123), which is, in turn, connected to the input of a global sense amplifier (128). The global sense amplifier (128) generates an output, OUT, of the segmented bit line structure (110).

The local and global sense amplifiers (124, 126, 128) each have a precharge input, PRE, that is used to precharge the bit line segment connected to their respective inputs. Thus, each local bit line segment (119, 121, 123) has its own sense amplifier and precharge. This is necessary, because, due to the relatively small size of register file cells, register file cells cannot discharge bit lines very fast, i.e., register file cells are relatively slow when putting data on a bit line, and therefore, sense amplifiers are used to detect small changes on a bit line and output a full data value based on such bit line value changes caused by register file cells. Moreover, because register files need to be very fast for the reasons discussed above, the use of sense amplifiers increases the speed of accessing data as opposed to waiting for a register file cell to fully discharge a bit line. The function of the sense amplifier, in essence, is to "sense" the data in a particular register file cell.

Each register file cell (112, 114, 116, 118, 120, 122) has a respective read access transistor (130, 132, 134, 136, 138, 140), which is used to access data stored within the respective register file cell.

The widths of these read access transistors (130, 132, 134, 136, 138, 140) get progressively smaller as the positions of the respective register files cells (112, 114, 116, 118, 120, 122) they are in get closer to the global sense amplifier (128). Because the capacitance of a transistor is directly correlated to the width of the transistor, by decreasing the widths of the transistors in the register file cells on a segmented bit line structure, the capacitance on the segmented bit lines accordingly decreases. This directly leads to lower power consumption because capacitance and power consumption are related by the following relationship (Equation 1):

$$P = CV^2 f, \quad (1)$$

where P represents power consumption, C represents capacitance, V represents voltage, and f represents the frequency of operation. Thus, by reducing C, P is directly reduced.

Because there is less cumulative capacitance on each bit line segment (119, 121, 123), each bit line segment (119, 121, 123) is accordingly less loaded (117). Less load on a bit line segment leads to faster operation, and therefore, data access times decrease. Those skilled in the art will appreciate that other memory array structures, such as read only memory ("ROM") memory arrays, may also use the implementation discussed with reference to FIG. 4a.

Referring still to FIG. 4a, when data is accessed from a particular register file cell, the read access transistor in that register file cell is used to discharge the bit line segment to which it is connected depending upon the value stored within the register file cell. While the register file cell discharges a bit line segment, a local sense amplifier, which has its input connected to the bit line segment, outputs a data value based on whether its bit line segment input remains precharged or gets discharged. Thereafter, the data from the local sense amplifier ripples through the local bit line segments and local sense amplifiers in the remaining plurality of segments to the global sense amplifier, which, in turn, outputs the data value. Typically, the global sense amplifier is designed to handle the accumulation of parasitic capacitance on the local bit line segments.

Figure 4B:
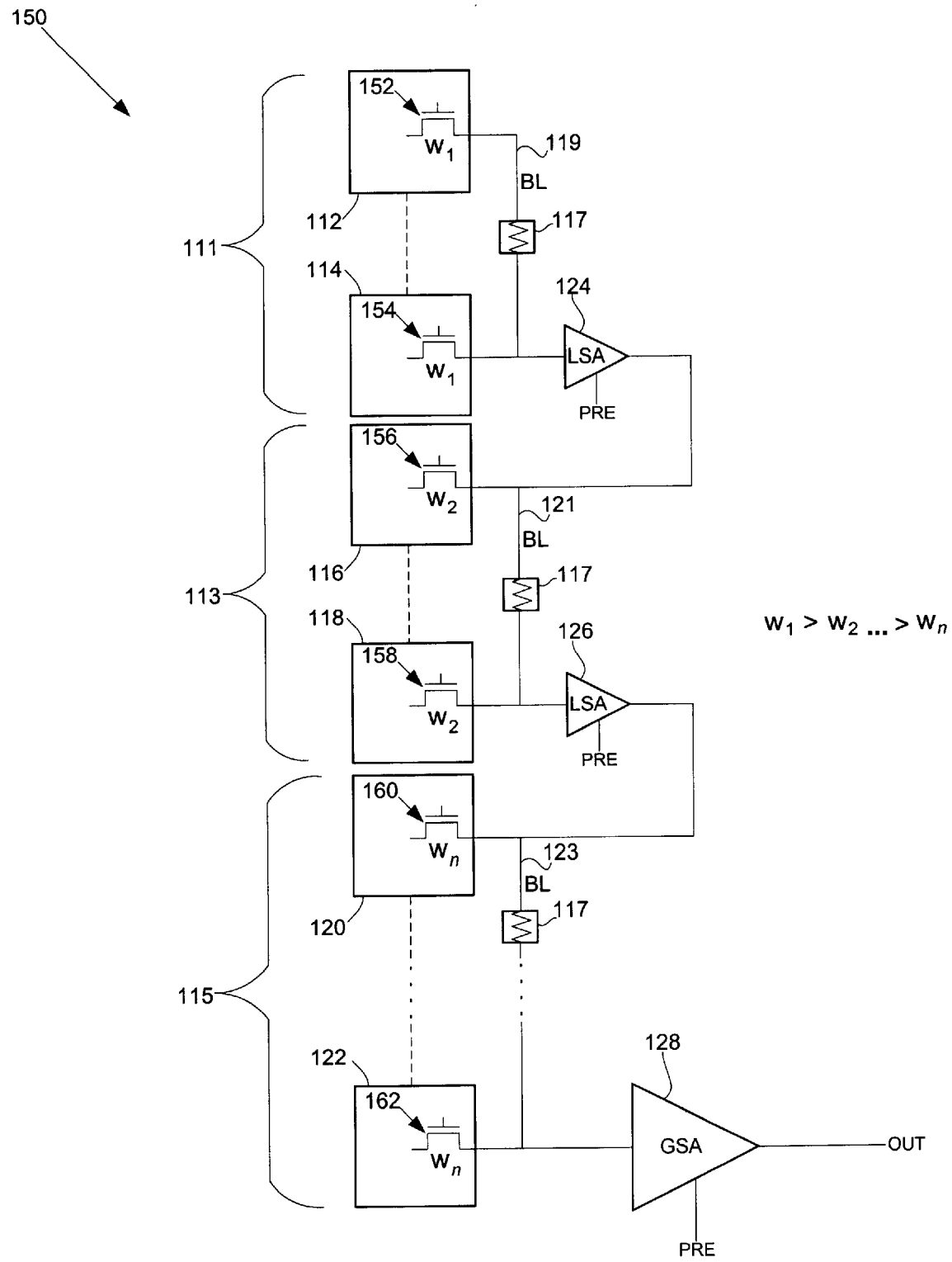
FIG. 4b shows a segmented bit line structure in accordance with another embodiment of the present invention.

In another exemplary embodiment, shown in FIG. 4b, a segmented bit line structure (150) has access transistors (152, 154, 156, 158, 160, 162) whose widths get progressively smaller as the positions of the respective bit line segments (111, 113, 115) they are in get closer to the global sense amplifier (128).

Figure 5:
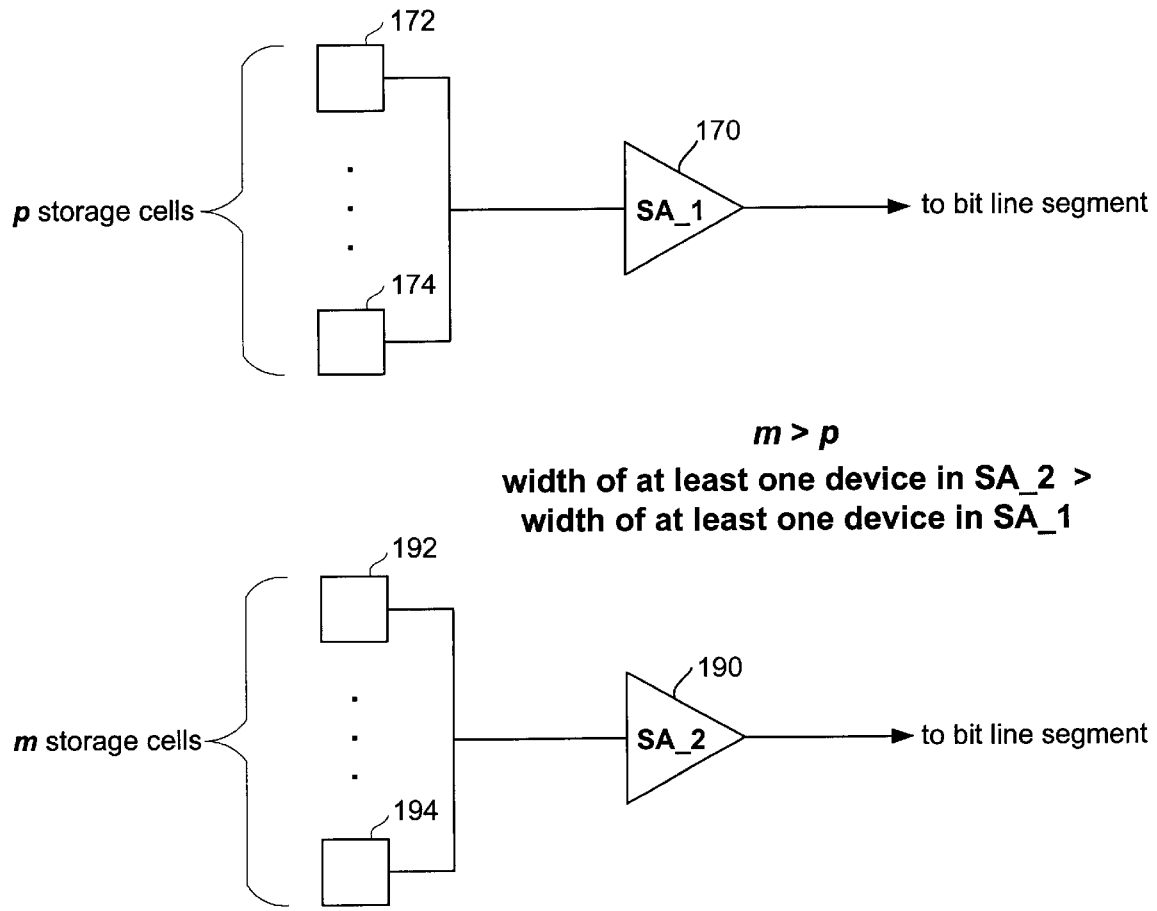
FIG. 5 shows a sense amplifier in accordance with an embodiment of the present invention.

FIG. 5 shows an exemplary embodiment of the present invention, in which a first sense amplifier (170) is designed such that a width of at least one device in the first sense amplifier (170) is smaller than a width of at least one device in a second sense amplifier (190) which has a larger number of storage cells connected to its input.

In FIG. 5, the first sense amplifier (170) is connected to p storage cells (only 172 and 174 are shown), where p represents the number of storage cells connected to the input of the first sense amplifier (170). Alternatively, the second sense amplifier (190) is connected to m storage cells (only 192 and 194 are shown), where m represents the number of storage cells connected to the input of the second sense amplifier (190). For purposes of this discussion with reference to FIG. 5, m is greater than p, i.e., the first sense amplifier (170) has less storage cells connected to its input than does the second sense amplifier (190).

Because the first sense amplifier (170) has less storage cells connected to its input than does the second sense amplifier (190), the width of at least one device in the first sense amplifier (170) is designed to be smaller than the width of at least one device in the second sense amplifier (190). This decreases capacitance on one or more devices within an individual sense amplifier, and, in turn, decreases the cumulative capacitance on a segmented bit line connected to that sense amplifier. This directly leads to lesser power consumption and increased speed when accessing data from a particular storage cell. Those skilled in the art will appreciate that other memory array structures, such as read only memory ("ROM") memory arrays, may also use the design discussed above with reference to FIG. 5.

Figure 6:
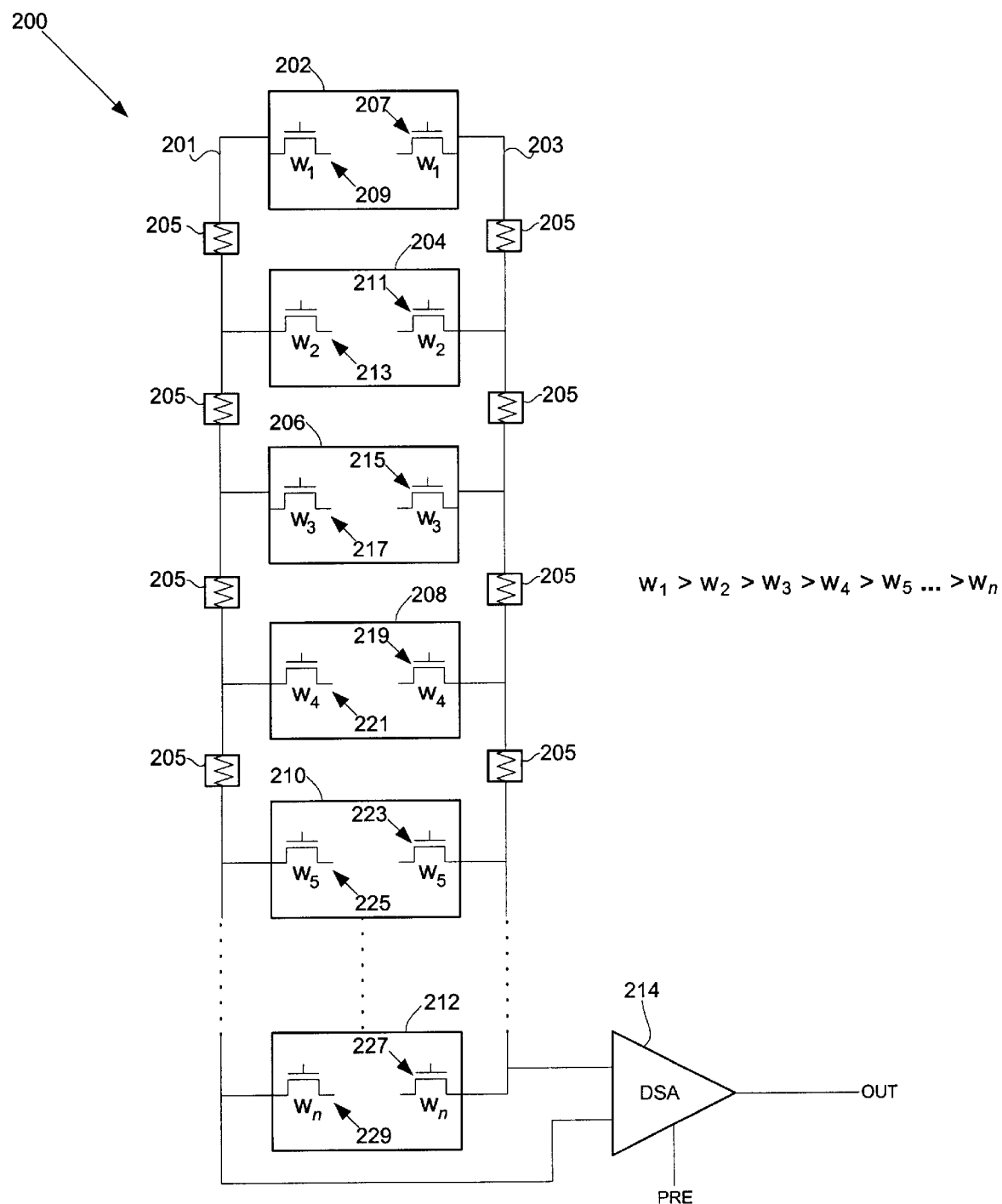
FIG. 6 shows a differential bit line structure in accordance with an embodiment of the present invention.

FIG. 6 shows a differential bit line structure of a register file in accordance with an exemplary embodiment of the present invention. In a differential bit line structure, register file cells have differential outputs which are connected to differential bit lines, respectively. For example, in the differential bit line structure (200) shown in FIG. 6, each register file cell (202, 204, 206, 208, 210, 212) is connected to two differential bit lines (201, 203) that both serve as inputs to a differential sense amplifier (214).

The differential sense amplifier (214) has a precharge input, PRE, that is used to precharge particular nodes (not shown) within the differential sense amplifier (214). Further, the differential sense amplifier (214) generates an output, OUT, of the differential bit line structure (200).

Each respective register file cell (202, 204, 206, 208, 210, 212) has two access transistors that have complementary inputs (207 and 209, 211 and 213, 215 and 217, 219 and 221, 223 and 225, 227 and 229). The widths of these access transistors (207 and 209, 211 and 213, 215 and 217, 219 and 221, 223 and 225, 227 and 229) get smaller as the positions of the respective register file cells (202, 204, 206, 208, 210, 212) they are in get closer to the differential sense amplifier (214).

Because the capacitance of a transistor is directly correlated to the width of the transistor, by decreasing the widths of the transistors in the register file cells on a differential bit line structure, the capacitance on the differential bit lines accordingly decreases. This directly leads to lower power consumption because capacitance and power consumption are directly related as shown in Equation 1 discussed above. Further, because there is less cumulative capacitance on each differential bit line (201, 203), each differential bit line (201, 203) is accordingly less loaded (205). Less load on a differential bit line leads to faster operation, and therefore, data access times decrease. Those skilled in the art will appreciate that other memory array structures, such as read only memory ("ROM") memory arrays, may also use the implementation discussed with reference to FIG. 6.

Referring still to FIG. 6, when data is accessed from a particular register file cell, one of the two complementary access transistors (referred to as "active access transistor") in that register file cell are used to selectively discharge the differential bit line to which the active read access transistor is connected depending upon the value stored within the register file cell. While the register file cell selectively discharges a precharged differential bit line, a differential sense amplifier, which has its inputs connected to two differential bit lines, outputs a data value to the output of the differential bit line structure based on whether the differential bit line connected to the active read access transistor remains precharged or gets discharged.

Figure 7A:
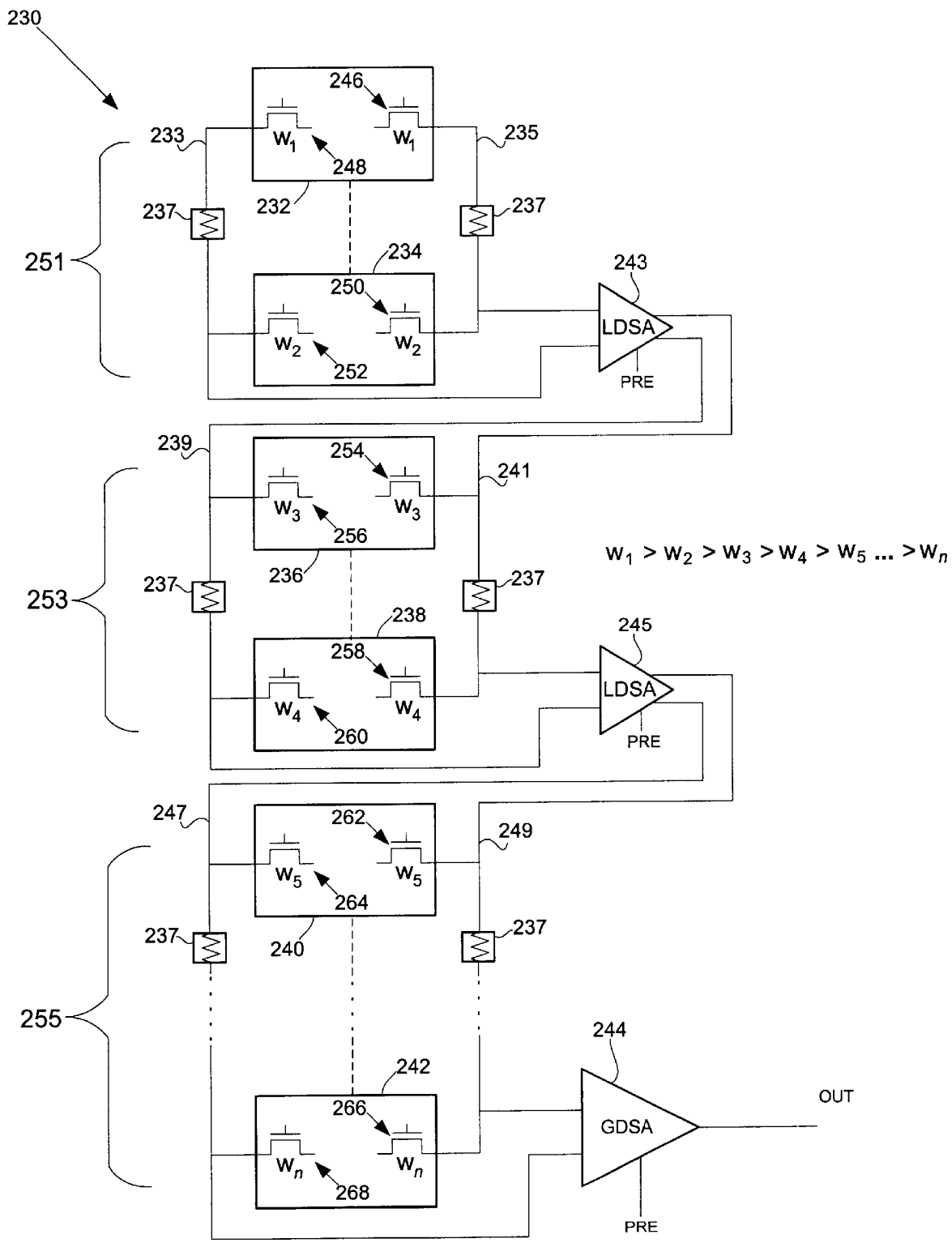
FIG. 7a shows a segmented differential bit line structure in accordance with an embodiment of the present invention.

FIG. 7a shows a segmented differential bit line structure of a memory array that consumes low power when data stored within a particular storage cell on the differential bit line structure is accessed, i.e., read, in accordance with an exemplary embodiment of the present invention. Specifically, FIG. 7a shows a segmented differential bit line structure (230) of a register file.

The segmented differential bit line structure (230) has register file cells (232, 234, 236, 238, 240, 242) that are segmented into a plurality of differential bit line segments (251, 253, 255). Each differential bit line segment (251, 253, 255) is connected to a respective pair of segmented differential bit lines (233 and 235, 239 and 241, 247 and 249). However, those skilled in the art will appreciate that in other embodiments, register file cells may not be segmented into a plurality of segments.

The pairs of segmented differential bit lines (233 and 235, 239 and 241, 247 and 249) are connected in series, with the first pair of segmented differential bit lines (233 and 235) being connected to inputs of a first differential sense (also referred to as "first local differential sense amplifier") (243). The outputs of the first local differential sense amplifier (243) are selectively connected to the second pair of segmented differential bit lines (239 and 241), which are, in turn, connected to inputs of a second differential sense amplifier (also referred to as "second local differential sense amplifier") (245). The outputs of the second local sense amplifier (245) are selectively connected to the third pair of segmented differential bit line segments (247 and 249), which are, in turn, connected to inputs of a global differential sense amplifier (244). The global sense amplifier (244) generates an output, OUT, of the segmented differential bit line structure (230).

The local and global differential sense amplifiers (243, 245, 244) each have a precharge input, PRE, that is used to selectively precharge the segmented differential bit lines connected to their respective inputs. Thus, each pair of segmented differential bit lines (233 and 235, 239 and 241, 247 and 249) has its own differential sense amplifier and precharge. This is necessary, because, due to the relatively small size of register file cells, register file cells cannot discharge bit lines very fast, i.e., register file cells are relatively slow when putting data on a bit line, and therefore, differential sense amplifiers are used to detect small changes on a segmented differential bit line and output a full data value based on such segmented differential bit line value changes caused by register file cells. Moreover, because register files need to be very fast for the reasons discussed above, the use of differential sense amplifiers increases the speed of accessing data as opposed to waiting for a register file cell to fully discharge a segmented differential bit line. The function of the differential sense amplifier, in essence, is to "sense" the data in a particular register file cell.

Each respective register file cell (232, 234, 236, 238, 240, 242) has two access transistors that have complementary inputs (246 and 248, 250 and 252, 254 and 256, 258 and 260, 262 and 264, 266 and 268) which is used to access data stored within the respective register file cell. The widths of these access transistors (246 and 248, 250 and 252, 254 and 256, 258 and 260, 262 and 264, 266 and 268) get smaller as the positions of the respective register file cells (232, 234, 236, 238, 240, 242) they are in get closer to the differential sense amplifier (244).

Because the capacitance of a transistor is directly correlated to the width of the transistor, by decreasing the widths of the transistors in the register file cells on a segmented differential bit line structure, the capacitance on the pairs of segmented differential bit lines accordingly decreases. This directly leads to lower power consumption because capacitance and power consumption are related by Equation 1 (discussed above with reference to FIG. 4a).

Further, because there is less cumulative capacitance on each pair of segmented differential bit lines (233 and 235, 239 and 241, 247 and 249), each pair of segmented differential bit lines (233 and 235, 239 and 241, 247 and 249) is accordingly less loaded (237). Less load on a segmented differential bit line leads to faster operation, and therefore, data access times decrease. Those skilled in the art will appreciate that other memory array structures, such as read only memory ("ROM") memory arrays, may also use the implementation discussed with reference to FIG. 7a.

Referring still to FIG. 7a, when data is accessed from a particular register file cell, the active access transistor in that register file cell is used to selectively discharge the segmented differential bit line to which it is connected depending upon the value stored within that active access transistor. While the register file cell, via the active access transistor, discharges a segmented differential bit line, a local differential sense amplifier, which has one of its inputs connected to the segmented differential bit line (which is connected to the active access transistor), outputs a data value based on whether that segmented differential bit line input remains precharged or gets discharged. Thereafter, the data from the local differential sense amplifier ripples through the pairs of segmented differential bit lines and local differential sense amplifiers in the remaining plurality of segments to the global differential sense amplifier, which, in turn, outputs the data value. Typically, the global differential sense amplifier is designed to handle the accumulation of parasitic capacitance on the local bit line segments.

Figure 7B:
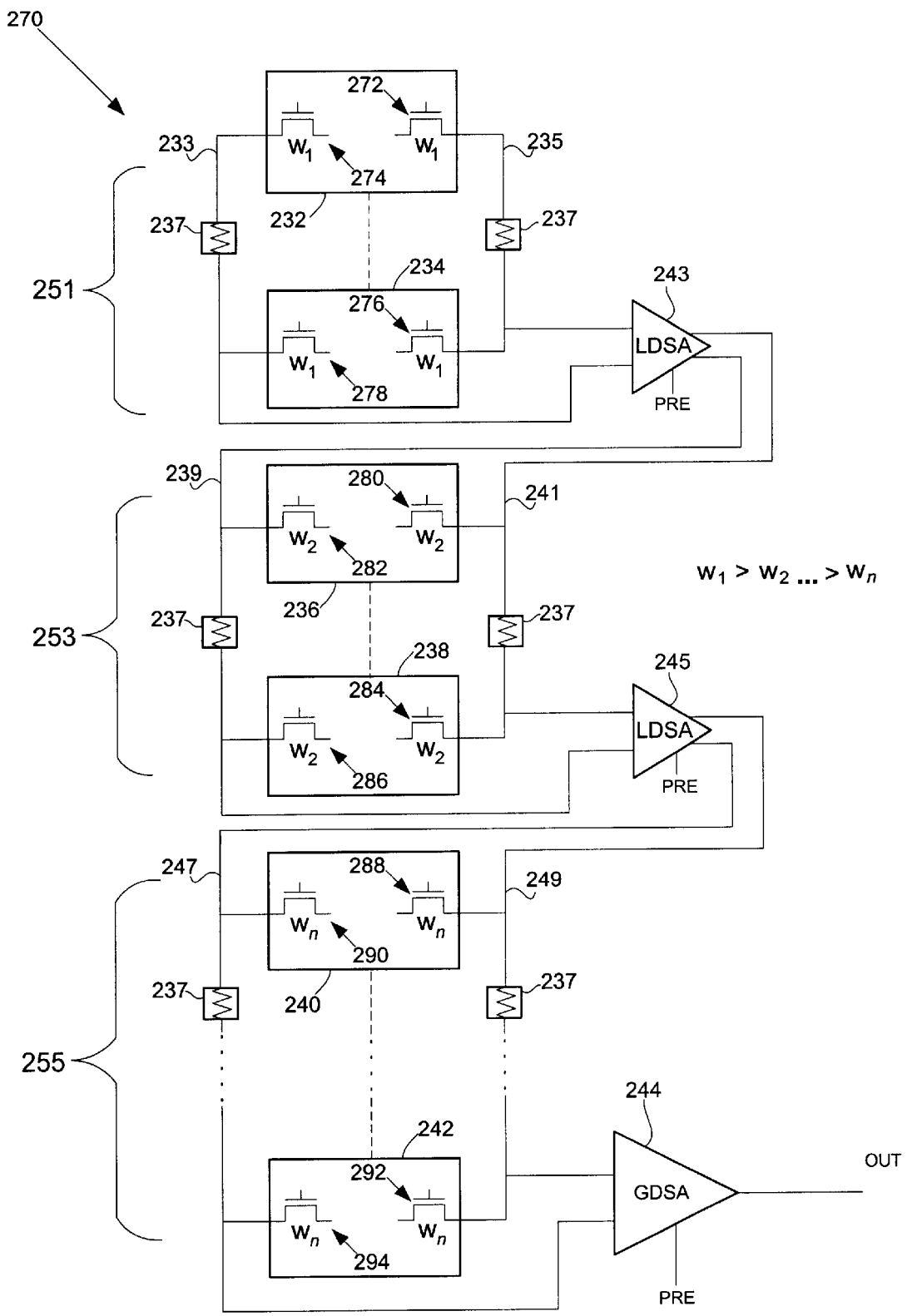
FIG. 7b shows a segmented differential bit line structure in accordance with another embodiment of the present invention.

In another exemplary embodiment, shown in FIG. 7b, a segmented differential bit line structure (270) has access transistors (272 and 274, 276 and 278, 280 and 282, 284 and 286, 288 and 290, 292 and 294) whose widths get progressively smaller as the positions of the respective differential bit line segments (251, 253, 255) they are in get closer to the global sense amplifier (244).

Figure 8:
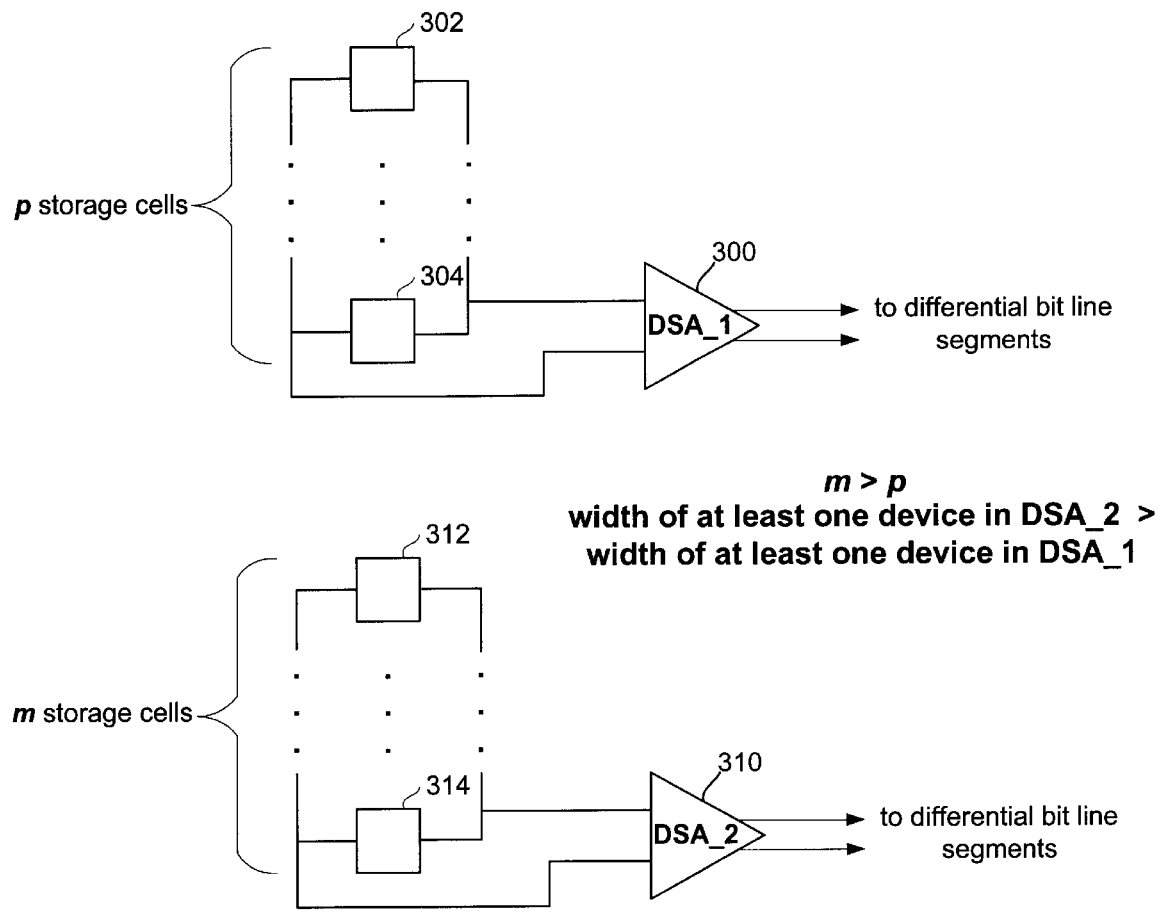
FIG. 8 shows a differential sense amplifier in accordance with an embodiment of the present invention.

FIG. 8 shows an exemplary embodiment of the present invention, in which a first differential sense amplifier (300) is designed such that a width of at least one device in the first differential sense amplifier (300) is smaller than a width of at least one device in a second differential sense amplifier (310) which has a larger number of storage cells connected to its inputs.

In FIG. 8, the first differential sense amplifier (300) is connected to p storage cells (only 302 and 304 are shown), where p represents the number of storage cells connected to inputs of the first differential sense amplifier (300). Alternatively, the second differential sense amplifier (310) is connected to m storage cells (only 312 and 314 are shown), where m represents the number of storage cells connected to inputs of the second differential sense amplifier (310). For purposes of this discussion with reference to FIG. 8, m is greater than p, i.e., the first differential sense amplifier (300) has less storage cells connected to its inputs than does the second differential sense amplifier (310).

Because the first differential sense amplifier (300) has less storage cells connected to its inputs than does the second differential sense amplifier (310), the width of at least one device in the first differential sense amplifier (300) is designed to be smaller than the width of at least one device in the second differential sense amplifier (310). This decreases capacitance on devices within an individual differential sense amplifier, and, in turn, decreases the cumulative capacitance on a segmented differential bit line connected to that differential sense amplifier. This directly leads to lesser power consumption and increased speed when accessing data from a particular storage cell. Those skilled in the art will appreciate that other memory array structures, such as read only memory ("ROM") memory arrays, may also use the design discussed above with reference to FIG. 8.

Advantages of the present invention may include one or more of the following. As described above, according to the invention, a segmented bit line structure in a memory array uses access transistors that have smaller widths, thus resulting in less capacitance on one or more bit line segments. Because there is less capacitance on one or more bit line segments, the bit line segments are less loaded. This allows for faster operation when accessing data from storage cells on the segmented bit line structure. Further, because there is less capacitance, there is less power consumption.

In other embodiments, widths of one or more devices in sense amplifiers arranged on a segmented bit line structure have smaller widths relative to widths of one or more devices in sense amplifiers that have larger numbers of storage cells connected to their inputs. Because devices in one or more sense amplifiers have smaller widths, the cumulative capacitance on a segmented bit line structure is decreased, and the segmented bit line structure becomes less loaded and operates faster when data from a storage cell on the segmented bit line structure is accessed.

In alternative embodiments, a differential bit line structure in a memory array uses access transistors that have smaller widths, thus resulting in less capacitance on one or more differential bit lines. Because there is less capacitance on one or more differential bit lines, the differential bit lines are less loaded. This allows for faster operation when accessing data from storage cells on the differential bit line structure. Further, because there is less capacitance, there is less power consumption.

In one or more embodiments, a segmented differential bit line structure in a memory array uses access transistors that have smaller widths, thus resulting in less capacitance on one or more differential bit line segments. Because there is less capacitance on one or more differential bit line segments, the differential bit line segments are less loaded. This allows for faster operation when accessing data from storage cells on the segmented differential bit line structure. Further, because there is less capacitance, there is less power consumption.

In other embodiments, widths of one or more devices in a differential sense amplifiers arranged on a segmented differential bit line structure have smaller widths relative to one or more devices in differential sense amplifiers that have larger numbers of storage cells connected to their inputs. Because one or more devices in differential sense amplifiers have smaller widths, the cumulative capacitance on a segmented differential bit line structure is decreased, and the segmented differential bit line structure becomes less loaded and operates faster when data from a storage cell on the segmented differential bit line structure is accessed.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A segmented bit line structure, comprising:
   a first segment of storage cells that are connected to an input of a first sense amplifier, wherein storage cells in the first segment each comprise at least one access transistor; and
   a second segment of storage cells that are connected to an input of a second sense amplifier, wherein storage cells in the second segment each comprise at least one access transistor;
   wherein access transistors in the second segment of storage cells have smaller widths than access transistors in the first segment of storage cells.

2. The segmented bit line structure of claim 1, further comprising:
   a last segment of storage cells that are connected to an input of a global sense amplifier, wherein storage cells in the last segment each comprise at least one access transistor;
   wherein access transistors in the last segment of storage cells have smaller widths than access transistors in the second segment of storage cells.

3. The segmented bit line structure of claim 2, wherein the first, second, and last segments of storage cells are connected by segmented bit lines.

4. The segmented bit line structure of claim 2, wherein data accessed from an access transistor in one selected from the group consisting of the first segment of storage cells, the second segment of storage cells, and the last segment of storage cells flows from the access transistor to an input to the global sense amplifier, and wherein the global sense amplifier generates an output based on the input to the global sense amplifier.

5. The segmented bit line structure of claim 2, wherein an access transistor in one selected from the group consisting of the first segment of storage cells, the second segment of storage cells, and the last segment of storage cells has a width dependent upon a position of a segment that comprises the access transistor.

6. The segmented bit line structure of claim 2, wherein an access transistor in one selected from lie group consisting of the first segment of storage cells, the second segment of storage cells, and the last segment of storage cells has a width dependent upon a position of a storage cell that comprises the access transistor.

7. The segmented bit line structure of claim 1, wherein a width of at least one device in the second sense amplifier is smaller than a width of at least one device in the first sense amplifier depending upon whether the second sense amplifier has less storage cells connected to the input of the second sense amplifier than the first sense amplifier.

8. The segmented bit line structure of claim 2, wherein a width of at least one device in a sense amplifier is smaller than a width of at least one device in the global sense amplifier depending upon whether the sense amplifier has less storage cells connected to an input of the sense amplifier than the global sense amplifier.

9. A method for accessing a data value from a segmented bit line structure in a memory array, comprising:
accessing the data value using an access transistor in a storage cell on the segmented bit line structure, wherein a width of the access transistor is related to a position of the access transistor on the segmented bit line structure in reference to an output of the segmented bit line structure; and
selectively propagating the data value to the output of the segmented bit line structure.

10. The method of claim 9, wherein the position of the access transistor is dependent upon a position of a storage cell on the segmented bit line structure that comprises the access transistor.

11. The method of claim 9, wherein the position of the access transistor is dependent upon a position of a segment on the segmented bit line structure that comprises the access transistor.

12. The method of claim 9, wherein the width of the access transistor is smaller than that of another access transistor that is in a storage cell positioned further from the output of the segmented bit line structure.

13. The method of claim 12, wherein capacitance on a segmented bit line is directly related to the width of the access transistor, wherein the cumulative capacitance is less due to the smaller width of the access transistor, and wherein time needed to access the data value is decreased due to less load on the segmented bit line.

14. The method of claim 9, wherein the width of the access transistor is smaller than that of another access transistor that is in a segment positioned further from the output of the segmented bit line structure.

15. The method of clam 9, further comprising:
using a smaller width for at least one device in a first sense amplifier on the segmented bit line structure than that of at least one device in a second sense amplifier that has a greater amount of storage cells connected to an input of the second sense amplifier than the first sense amplifier.

16. A segmented differential bit line structure, comprising:
a first segment of storage cells that are connected to inputs of a first differential sense amplifier, wherein storage cells in the first segment each comprise complementary access transistors; and
a second segment of storage cells that are connected to inputs of a second differential sense amplifier, wherein storage cells in the second segment each comprise complementary access transistors;
wherein widths of the complementary access transistors in the second segment of storage cells are smaller than widths of complementary access transistors in the first segment of storage cells.

17. The segmented differential bit line structure of claim 16, further comprising:
a last segment of storage cells that are connected to inputs of a global differential sense amplifier, wherein storage cells in the last segment each comprise complementary access transistors;
wherein widths of the complementary access transistors in the last segment of storage cells are smaller than widths of the complementary access transistors in the second segment of storage cells.

18. The segmented differential bit line structure of claim 17, wherein the first, second, and last segments of storage cells are connected by pairs of segmented differential bit lines.

19. The segmented differential bit line structure of claim 17, wherein data accessed from an access transistor in one selected from the group consisting of the first segment of storage cells, the second segment of storage cells, and the last segment of storage cells flows from the access transistor to at least one input of the global differential sense amplifier, and wherein the global differential sense amplifier generates an output based on the at least one input to the global differential sense amplifier.

20. The segmented differential bit line structure of claim 17, wherein an access transistor in one selected from the group consisting of the first segment of storage cells, the second segment of storage cells, and the last segment of storage cells has a width dependent upon a position of a segment that comprises the access transistor.

21. The segmented differential bit line structure of claim 17, wherein an access transistor in one selected from the group consisting of the first segment of storage cells, the second segment of storage cells, and the last segment of storage cells has a width dependent upon a position of a storage cell that comprises the access transistor.

22. The segmented differential bit line structure of claim 16, wherein a width of at least one device in the second differential sense amplifier is smaller than a width of at least one device in the first differential sense amplifier depending upon whether the second differential sense amplifier has less storage cells connected to inputs of the second differential sense amplifier than the first differential sense amplifier.

23. The segmented differential bit line structure of claim 17, wherein a width of at least one device in a differential sense amplifier is smaller than a width of at least one device in the global differential sense amplifier depending upon whether the differential sense amplifier has less storage cells connected to inputs of the differential sense amplifier than the global differential sense amplifier.

24. A differential bit line structure, comprising:
a first storage cell, wherein the first storage cell comprises complementary access transistors; and
a second storage cell, wherein the second storage cell comprises complementary access transistors;

wherein widths of the complementary access transistors in the second storage cell are smaller than widths of the complementary access transistors in the first storage cell.

25. The differential bit line structure of claim 24, further comprising:
a last storage cell, wherein the last storage cell comprises complementary access transistors;
wherein widths of the complementary access transistors in the last storage cell are smaller than widths of the complementary access transistors in the second storage cell.

26. The differential bit line structure of claim 25, wherein the complementary access transistors in the first, second, and last storage cells are connected to at least one selected from the group consisting of a first differential bit line and a second differential bit line.

27. The differential bit line structure of claim 26, wherein the first differential bit line and the second differential bit line connect the first, second, and last storage cells, and wherein the first differential bit line and the second differential bit line serve as inputs to a differential sense amplifier.

28. The differential bit line structure of claim 27, wherein data accessed from an access transistor in one selected from the group consisting of the first storage cell, the second storage cell, and the last storage cell flows from the access transistor to at least one input of the differential sense amplifier.

29. The differential bit line structure of claim 27, wherein the differential sense amplifier generates an output of the differential bit line structure.

30. The differential bit line structure of claim 27, wherein the last storage cell is positioned closer to the differential sense amplifier than the second storage cell, and wherein the second storage cell is positioned closer to the differential sense amplifier than the first storage cell.

31. A method for accessing a data value from a differential bit line structure in a memory array, comprising:
selectively accessing the data value using an access transistor in a storage cell on the differential bit line structure, wherein a width of the access transistor is related to a position of the access transistor on the differential bit line structure in reference to an output of the differential bit line structure; and
selectively propagating the data value to the output of the differential bit line structure.

32. The method of claim 31, wherein the position of the access transistor is dependent upon a position of a storage cell on the differential bit line structure that comprises the access transistor.

33. The method of claim 31, wherein the position of the access transistor is dependent upon a position of a segment on the differential bit line structure that comprises the access transistor.

34. The method of claim 31, wherein the width of the access transistor is smaller than that of another access transistor that is in a storage cell positioned further from the output of the differential bit line structure.

35. The method of claim 34, wherein capacitance on a differential bit line is directly related to the width of the access transistor, wherein the cumulative capacitance is less due to the smaller width of the access transistor, and wherein time needed to access the data value is decreased due to less load on the differential bit line.

36. The method of claim 31, wherein the width of the access transistor is smaller than that of another access transistor that is in a segment positioned further from the output of the differential bit line structure.

* * * * *